(12) United States Patent
Bahai

(10) Patent No.: US 7,205,923 B1
(45) Date of Patent: *Apr. 17, 2007

(54) PIPELINED ANALOG TO DIGITAL CONVERTER THAT IS CONFIGURABLE BASED ON MODE AND STRENGTH OF RECEIVED SIGNAL

(75) Inventor: Ahmad Bahai, Lafayette, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/007,057

(22) Filed: Dec. 7, 2004

(51) Int. Cl.
*H03M 1/38* (2006.01)

(52) U.S. Cl. .................... 341/161; 341/155; 341/156

(58) Field of Classification Search ............ 341/161, 341/139, 155, 156; 702/96, 106; 375/232, 375/343, 348; 370/350; 710/100, 110; 711/100, 711/170; 712/24

See application file for complete search history.

(56) References Cited

U.S. PATENT DOCUMENTS

| | | | | |
|---|---|---|---|---|
| 4,439,839 | A | 3/1984 | Kneib et al. | 711/100 |
| 4,641,238 | A | 2/1987 | Kneib | 710/110 |
| 4,837,678 | A | 6/1989 | Culler et al. | 712/204 |
| 5,237,673 | A | 8/1993 | Orbits et al. | 711/170 |
| 5,479,453 | A | 12/1995 | Anvari et al. | 375/348 |
| 5,623,684 | A | 4/1997 | El-Ghoroury et al. | 712/37 |
| 5,692,207 | A | 11/1997 | Ho-Lung et al. | 712/36 |
| 5,854,904 | A | 12/1998 | Brown | 710/100 |
| 5,867,400 | A | 2/1999 | El-Ghoroury et al. | 716/1 |
| 5,901,301 | A | 5/1999 | Matsuo et al. | 712/212 |
| 6,067,295 | A | 5/2000 | Bahai et al. | 370/350 |
| 6,097,770 | A | 8/2000 | Bahai et al. | 375/343 |
| 6,275,525 | B1 | 8/2001 | Bahai et al. | 375/232 |
| 6,340,944 | B1 * | 1/2002 | Chang et al. | 341/161 |
| 6,446,193 | B1 | 9/2002 | Alidina et al. | 712/35 |
| 6,453,407 | B1 | 9/2002 | Lavi et al. | 712/24 |
| 6,486,820 | B1 * | 11/2002 | Allworth et al. | 341/161 |
| 6,507,799 | B2 * | 1/2003 | Steffen | 702/96 |
| 6,864,817 | B1 * | 3/2005 | Salvi et al. | 341/139 |
| 6,975,950 | B2 * | 12/2005 | Bardsley | 702/106 |
| 6,980,148 | B1 * | 12/2005 | Bahai | 341/161 |
| 7,009,548 | B2 * | 3/2006 | Chiang et al. | 341/161 |
| 2004/0125008 | A1 * | 7/2004 | Yamaji | 341/155 |

OTHER PUBLICATIONS

Hennessy and Patterson, "Computer Architecture—A Quantitative Approach," 2nd Edition, 1996, pp. 87-88, no month.

(Continued)

*Primary Examiner*—Jean Bruner Jeanglaude
(74) *Attorney, Agent, or Firm*—Darby & Darby PC; Matthew M. Gaffney

(57) ABSTRACT

A pipelined analog to digital converter (ADC) that is arranged to dynamically adapt its resolution and sampling frequency based on at least a determined mode of communication and the strength of a received wireless signal. Since standby mode data is typically communicated with a relatively low number of bits (low resolution), the ADC provides for disabling at least a portion of its pipelined stages that provide the higher resolution bits if the standby communication mode is detected. By lowering the ADC's resolution for standby mode communication, it can conserve a considerable amount of power associated with the operation of the higher resolution bits. Similarly, relatively high resolution communication such as receiving and transmitting data and/or voice is process by the ADC by enabling sufficient pipelined stages to provide a higher number of bits.

19 Claims, 6 Drawing Sheets

OTHER PUBLICATIONS

Stiller et al., "A Flexible Middleware for Multimedia Communication: Design, Implementation, and Experience," IEEE JSAC Special Issue on Middleware, vol. 17, No. 9, pp. 1614-1631, 1999, no month.

Khoo et al., U.S. Appl. No. 09/458,131, filed Dec. 9, 1999 (copy not attached).

Ma et al., U.S. Appl. No. 09/348,783, filed Jul. 7, 1999 (copy not attached).

* cited by examiner

PIPELINED ANALOG TO DIGITAL CONVERTER THAT IS CONFIGURABLE BASED ON MODE AND STRENGTH OF RECEIVED SIGNAL

FIELD OF THE INVENTION

The invention is directed to analog to digital converters, and more particularly, to analog to digital converters with multiple stages that are pipelined.

BACKGROUND OF THE INVENTION

Analog to digital converters (ADCs) are employed in a wide variety of applications. For example, ADCs are often used in audio recording equipment to convert analog audio signals into digital signals that can be stored on digital media. Also, ADCs are usually employed to convert a received wireless (analog) signal into a digital signal for further processing by other components in a mobile device.

For wireless communication, the amount of resolution (number of bits) and/or sampling frequency for an ADC to actually process a wireless (analog) signal can vary widely based on a variety of circumstances. For example, if a mobile device is operating in a monitor mode (waiting to receive a wireless signal addressed to the mobile device), the resolution and sampling frequency employed by the ADC can be relatively low. In contrast, during voice communication between mobile devices over a relatively long distance, an ADC might need to employ a relatively high sampling frequency and resolution to ensure that the voice data is communicated in real time.

Typically, the resolution and sampling frequency values of an ADC for a mobile device are set at least as high as the highest values necessary to process the most complex wireless communication such as voice communication over a relatively long distance. Unfortunately, these higher values typically cause the ADC to consume more power than necessary for much of the time that the mobile device is monitoring wireless signals in a standby mode. In the past, ADCs have not been able to dynamically adapt their resolution and/or sampling frequencies to the minimum values necessary to support different types of wireless communication modes and protocols over differing distances.

DETAILED DESCRIPTION OF THE INVENTION

Figure 1:
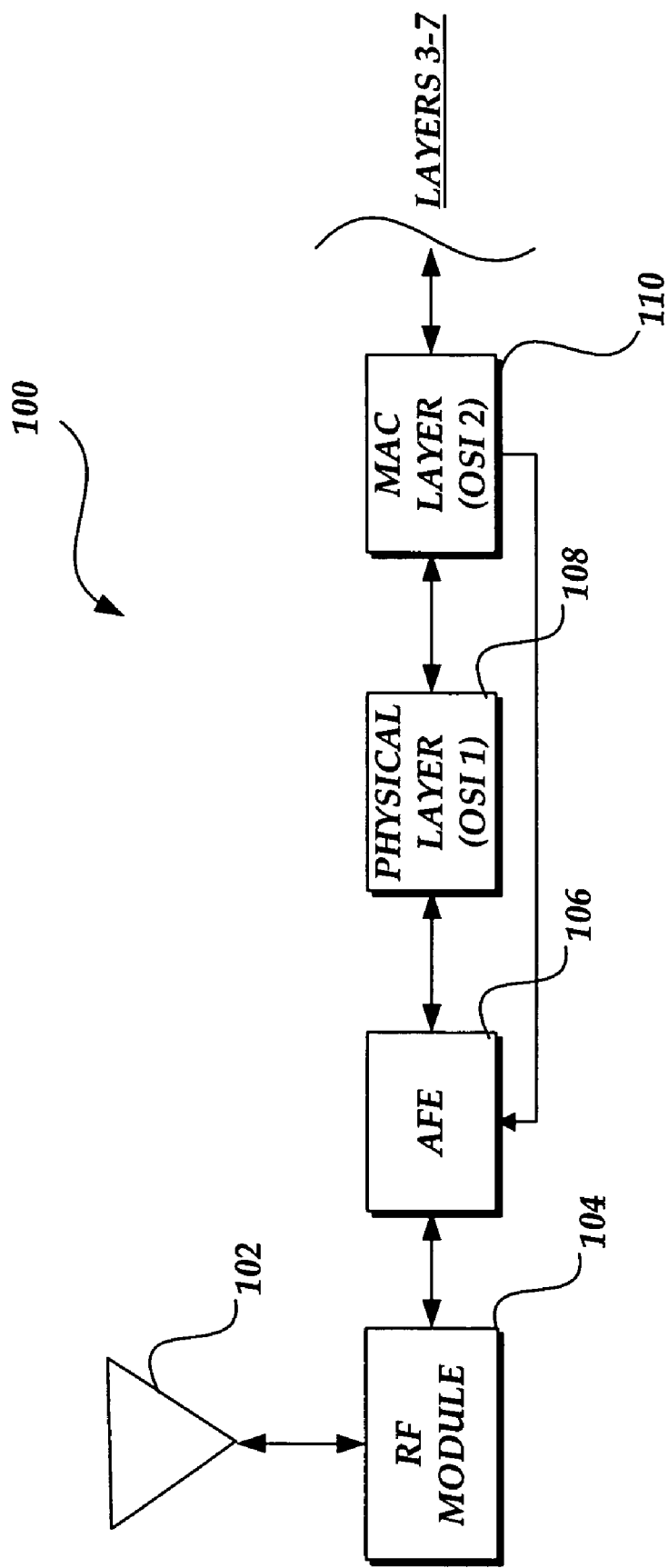
FIG. 1 illustrates a block diagram of modules that process wireless communications for a mobile device.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Briefly stated, the invention is directed to an inventive architecture for a pipelined analog to digital converter that is arranged to dynamically adapt its resolution and sampling frequency based on a determined mode of communication and the strength of a received wireless signal. Since standby mode data is typically communicated with a relatively low number of bits (low resolution), the inventive ADC provides for disabling at least a portion of its pipelined stages that provide the higher resolution bits if the standby communication mode is detected. By lowering the ADC's resolution for standby mode communication, it can conserve a considerable amount of power associated with the operation of the higher resolution bits. Similarly, the inventive ADC can dynamically adapt to relatively high resolution communication such as receiving and transmitting data and/or voice by enabling sufficient pipelined stages to provide the higher number of bits.

Additionally, since the separate circuitry for each additional bit of resolution in an ADC can typically cause an increase in power of two to four times, substantial amounts of power can be saved by disabling pipelined ADC stages for a communication mode where a lower resolution is sufficient. For example, a resolution of 12 bits could be employed to support a 70 decibel (db) dynamic range for an ADC. Communication applications that can make use of a relatively high resolution could include voice, video, and the like. In contrast, an ADC resolution of just 6 or 7 bits might be sufficient for standby mode communication with a 40 db dynamic range. Also, a flash ADC module is typically included in the pipelined stages that are employed to dynamically enable/disable higher resolutions for the inventive pipelined ADC.

Additionally, the sampling frequency of the inventive pipelined ADC can be dynamically increased or decreased to process relatively weak or strong wireless signals. For example, if a mobile device was disposed relatively adjacent to a wireless access point, the received signal would be relatively strong and the sampling frequency could be reduced. Similarly, if the mobile device was disposed relatively far away from an access point, the received signal would be relatively weak and the sampling frequency could be reduced. Also, the inventive ADC can be arranged to adjust its sampling frequency in regard to a particular data and/or voice communication protocol. For example, a voice and/or data communication protocol may require the received wireless signal to be sampled at or above a particular frequency.

Architecture

FIG. 1 illustrates a block diagram overview 100 of modules that process wireless communications for a mobile device with the inventive pipelined ADC. Antenna 102 transmits and receives wireless signals and it is coupled to Radio Frequency (RF) module 104. RF module 104 physically generates wireless signals that are transmitted by antenna 102 and the RF module also physically converts a wireless signal received by antenna 102 into an analog signal that can be processed by Analog Front End (AFE) 106. Although not shown, the inventive coupled ADC is included in AFE 106, and the ADC converts the received analog signal into a digital signal. AFE 106 is coupled to Physical Layer module 108 where the digital signal is arranged into a raw bit stream for further processing by Data Link Layer module 110.

At Data Link Layer module 110, the raw bit stream is packaged into frames for subsequent processing by other modules that operate substantially in accordance with the three through seven layers of the Open Systems Interconnection (OSI) Reference model. Data Link Layer module 110 can also be characterized as the Media Access Control (MAC) Layer under the second layer of the OSI Reference model.

As shown, Data Link Layer module 110 provides feedback in regard to the operation of AFE module 106. A determination is made at the Data Link/MAC Layer in regard to a relatively minimum resolution and frequency for the inventive ADC to effectively process the current received analog signal into bits that can be included in the frame. This determination is provided to AFE module 106 as feedback that can cause the enablement/disablement of pipelined ADC stages and/or changes in the sampling frequency.

Figure 2A:
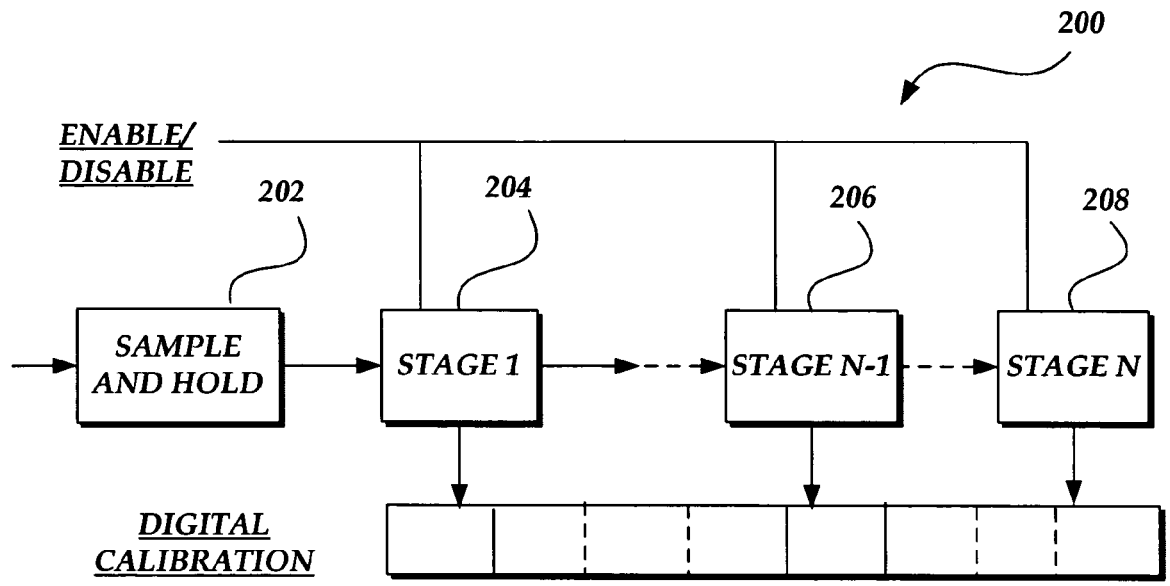
FIG. 2A shows a block diagram of several modules that implement the inventive pipelined ADC architecture in which each stage works on one or more bits of successive samples concurrently.

FIG. 2A illustrates a block diagram overview 200 of several modules employed to implement the inventive ADC which employs a parallel architecture in which each stage works on one or more bits of successive samples concurrently. This inherent parallelism increases throughput. Sample and Hold module 202, provides the received analog signal simultaneously to each of the N pipelined states 204, 206 and 208. An enable/disable control line is coupled to each of the stages and can be employed to separately control their operation. Also, although not shown, digital error correction logic for trimming, calibrating, and the like, is provided to reduce the accuracy requirement of Flash ADC modules included with each stage.

Figure 2B:
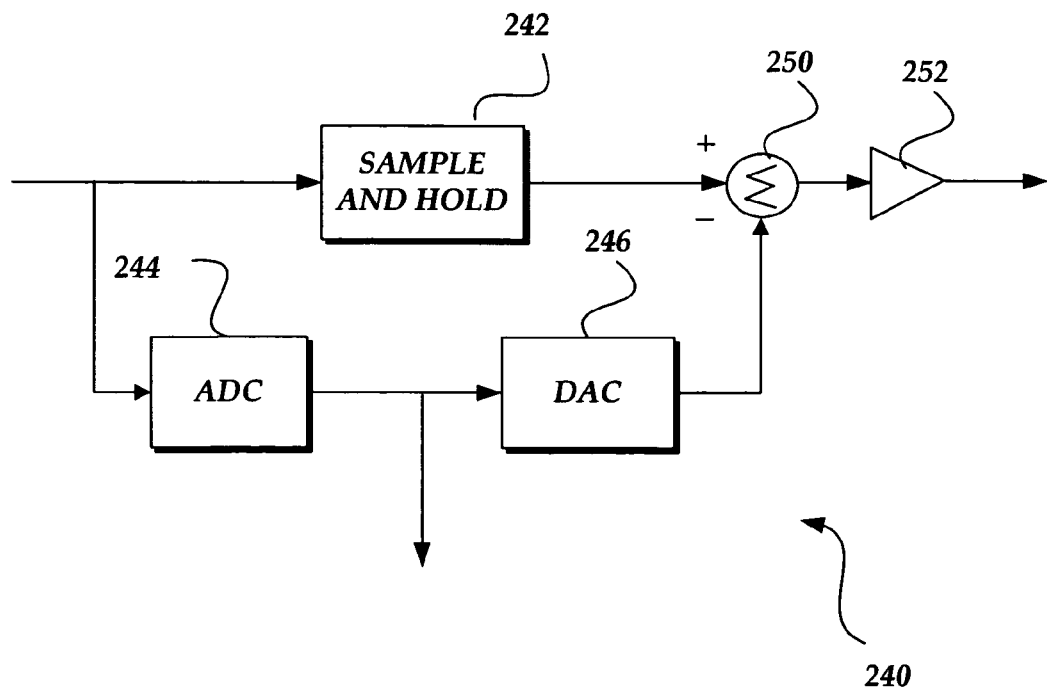
FIG. 2B illustrates a block diagram for an exemplary stage of the inventive pipelined ADC architecture.

FIG. 2B illustrates an overview of block diagram 240 for an exemplary stage for the inventive pipelined ADC architecture. The received signal is provided to sample and hold block 242 and ADC module 244, which is typically arranged with a Flash ADC configuration and mode of operation. The output of sample and hold module 242 is provided to differential node 250 whose output is provided to low gain amplifier 252. The output of amplifier 252 is provided to the next enabled stage in the inventive pipelined ADC.

Additionally, the output of ADC module 244 is provided as a digital output (bit) that is added to the total number of bits (resolution) for processing the received signal. Also, the output of ADC module 244 is provided to Digital to Analog Converter (DAC) module 246. The output of DAC module 246 is subtracted at differential node 250 from the output of sample and hold module 242.

The inventive pipelined ADC converts real-world analog data such as wireless signals into the digital form needed by other digital components. The inputs to the ADC are usually voltages (as opposed to currents), and may take any value within the ADC's specified range.

For example, if the inventive pipelined ADC was specified to handle +/−10 Volts, an analog input of +1.234567 Volts would be valid. The analog input can thus have "infinite" resolution, but the ADC's output would be limited to the number of bits (resolution) it can use to represent the value. For example, if the ADC had 8 bits, it could only encode 256 possible values ($2^8$=256). Also, if these values must handle the entire +/−10 Volt range (20 Volts), then the actual resolution would be 20/256 or 0.078125 Volts at best. So in this example, an analog input signal might be encoded as 15/256*20=1.171875 Volts, or maybe as 16/256*20=1.250000 Volts, but it will never be an "exact" value. This difference is called the "quantization error", and is typically reduced by increasing the number of bits (resolution) for the ADC, such 12 or 16 bits.

On a command from a clock, or some other external source, the inventive ADC "samples" the input voltage very briefly and holds that value as a charge on a capacitor, using a circuit called a "Sample and Hold" (S/H) or "Track and Hold" amplifier. During this "hold" time, the held analog voltage is converted into a digital number by those pipelined stages that are enabled.

Operating Environment

Figure 3:
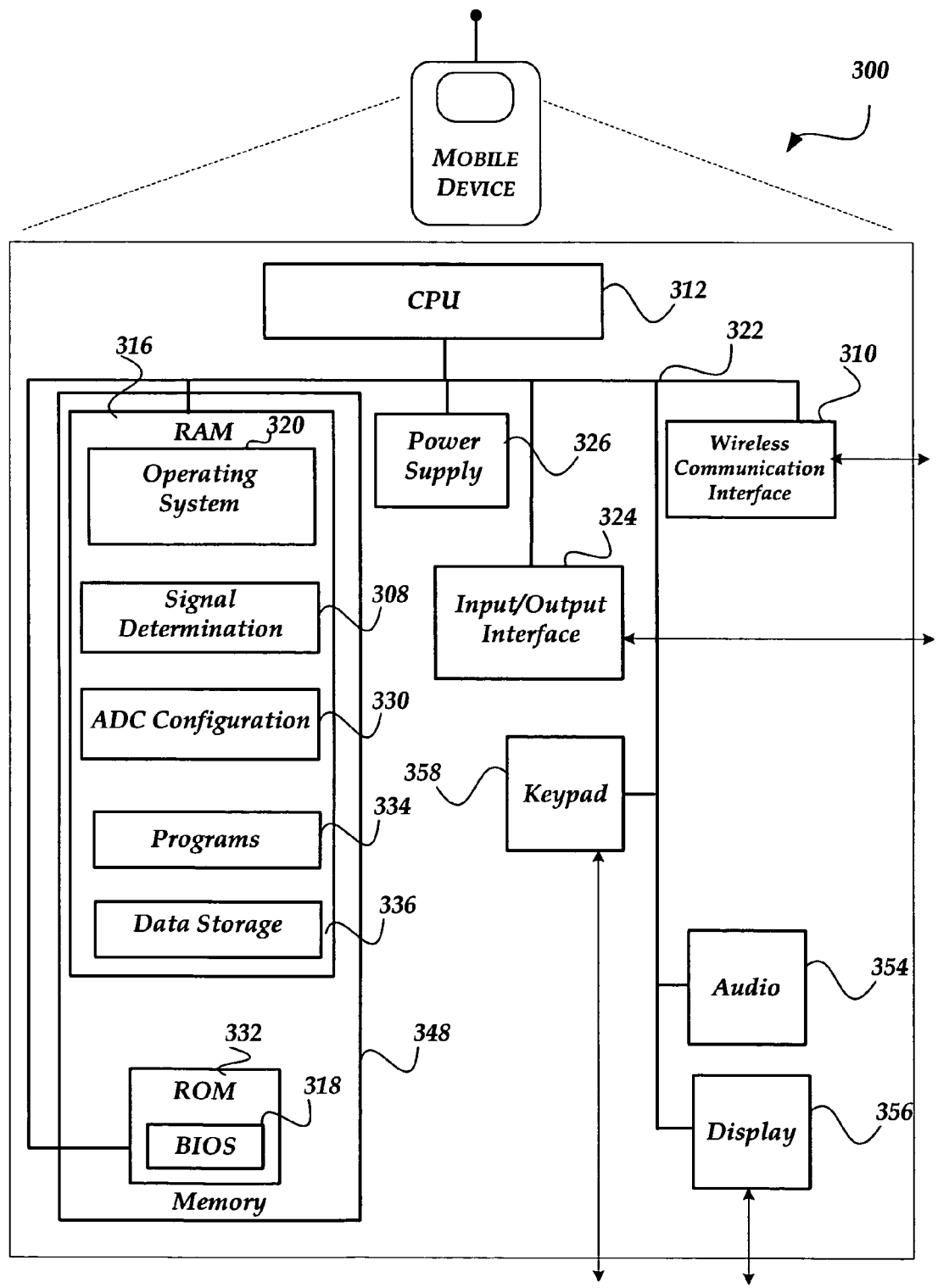
FIG. 3 is a schematic diagram that illustrates components that can be included in a mobile device.

FIG. 3 shows an overview of exemplary mobile device 300 that may comprise any wireless device. In one embodiment, mobile device 300 may be capable of simultaneously connecting to two or more different types of wireless networks, simultaneously connecting to multiple nodes of a single wireless network, simultaneously communicating over multiple channels to one or more networks, or otherwise simultaneously engaging in multiple communication sessions with different wireless protocols. Such devices include dual communication cellular telephones, smart phones, pagers, radio frequency (RF) devices, infrared (IR) devices, integrated devices combining one or more of the preceding devices, and the like. Mobile device 300 may also comprise other wireless interface devices that such as Personal Digital Assistants (PDAs), handheld computers, personal computers, multiprocessor systems, microprocessor-based or programmable consumer electronics, network PCs, wearable computers, and the like.

Mobile device 300 may include many more components than those shown in FIG. 3. As shown in the figure, mobile device 300 includes central processing unit 312 (CPU), memory 348, RAM 316, ROM 332, Operating System application 320, Signal Determination application 308, ADC Configuration application 330, programs 334, data storage 336, bios 318, power supply 326, Input/Output interface 324, Wireless Communication Interface 310, audio interface 354, display 356, and keypad 358.

Mobile device 300 may optionally communicate with a base station (not shown), or directly with another mobile device, via wireless interface 310. Wireless interface 310 includes circuitry for coupling mobile device 300 to various wireless networks, and are constructed for use with various communication protocols and technologies including, but not limited to, Code Division Multiple Access (CDMA), Time Division Multiple Access (TDMA), Global System for Mobile communication (GSM), Integrated Digital Enhanced Network (iDEN), Universal Mobile Telephony System (UMTS), CDMA2000, Wide CDMA (WCDMA), User Datagram Protocol (UDP), Transmission Control Protocol/ Internet Protocol (TCP/IP), Short Messaging Service (SMS), Multi-media Messaging Service (MMS), General Packet Radio Service (GPRS), Enhanced Data GSM Environment (EDGE), Wireless Application Protocol (WAP), Ultra Wide Band (UWB), Voice Over IP (VoIP), WiFi (802.11a, b, and g), IEEE 802.16 Worldwide Interoperability for Microwave Access (WiMax), and the like.

Mass memory 348 generally includes RAM 316, ROM 332, and one or more data storage units 336. Mass memory 348 as described above illustrates a type of computer-readable media, namely computer storage media. Computer storage media may include volatile and nonvolatile, removable and non-removable media implemented in any method or technology for storage of information such as computer readable instructions, data structures, program modules or other data. Examples of computer storage media include RAM, ROM, EEPROM, flash memory or other semiconductor memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device. Data storage 336 can be utilized by mobile device 300 to store, among other things, programs 334, databases and/or libraries of images, lists and other data.

The mass memory stores operating system 320 for controlling the operation of mobile device 300. It will be appreciated that this component may include a general purpose operating system such as a version of UNIX or LINUX™, or a specialized mobile communication operating system such as the Symbian® operating system.

The operating system preferably includes a module of handover control code 38 for determining whether and/or when to reroute a communication session from one network to a different network, as discussed in detail below.

Basic input/output system ("BIOS") 318 is also provided for controlling the low-level operation of mobile device 300. The mass memory further stores application code and data used by mobile device 300. More specifically, mass memory 348 stores Signal Determination application 308, ADC configuration application 330, and programs 334. Signal Determination application 308 may include computer executable instructions, which may be run under control of operating system 320 to determine the strength of a received wireless signal and/or the type of wireless protocol. ADC configuration application 330 may include computer executable instructions, which can be run under control of operating system 320 to arrange the resolution and frequency of the inventive pipelined ADC that can be included in Wireless Communication Interface 310. Also, programs 334 may include computer executable instructions which, when executed by mobile device 300, transmit and receive WWW pages, e-mail, audio, video, and enable wireless telecommunication with another user of another mobile device or wired telephone.

Mobile device 300 also comprises input/output interface 324 for communicating with external devices, such as a headset, or other input or output devices not shown in FIG. 3. Keypad 358 may comprise any input device arranged to receive input from a user. For example, keypad 358 may include a push button numeric dial, or a keyboard. Keypad 358 may also include command buttons that are associated with selecting and sending images. Display 356 may be a liquid crystal display (LCD), gas plasma, light emitting diode (LED), or any other type of display used with a mobile device. Display 356 may also include a touch sensitive screen arranged to receive input from an object such as a stylus or a digit from a human hand.

Power supply 326 provides power to mobile device 310. A rechargeable or non-rechargeable battery may be used to provide power. The power may also be provided by an external power source, such as an AC adapter or a powered docking cradle that supplements and/or recharges a battery.

As shown, mobile device 310 includes audio interface 354 is arranged to produce and receive audio signals such as the sound of a human voice. For example, audio interface 354 may be coupled to a speaker and microphone (not shown) to enable telecommunication with others and/or generate an audio acknowledgement for some action.

Additionally, although not shown, the Signal Determination application and/or the ADC configuration application can be implemented in hardware such as an Application Specific Integrated Circuit (ASIC).

Process Flowcharts

Figure 4:
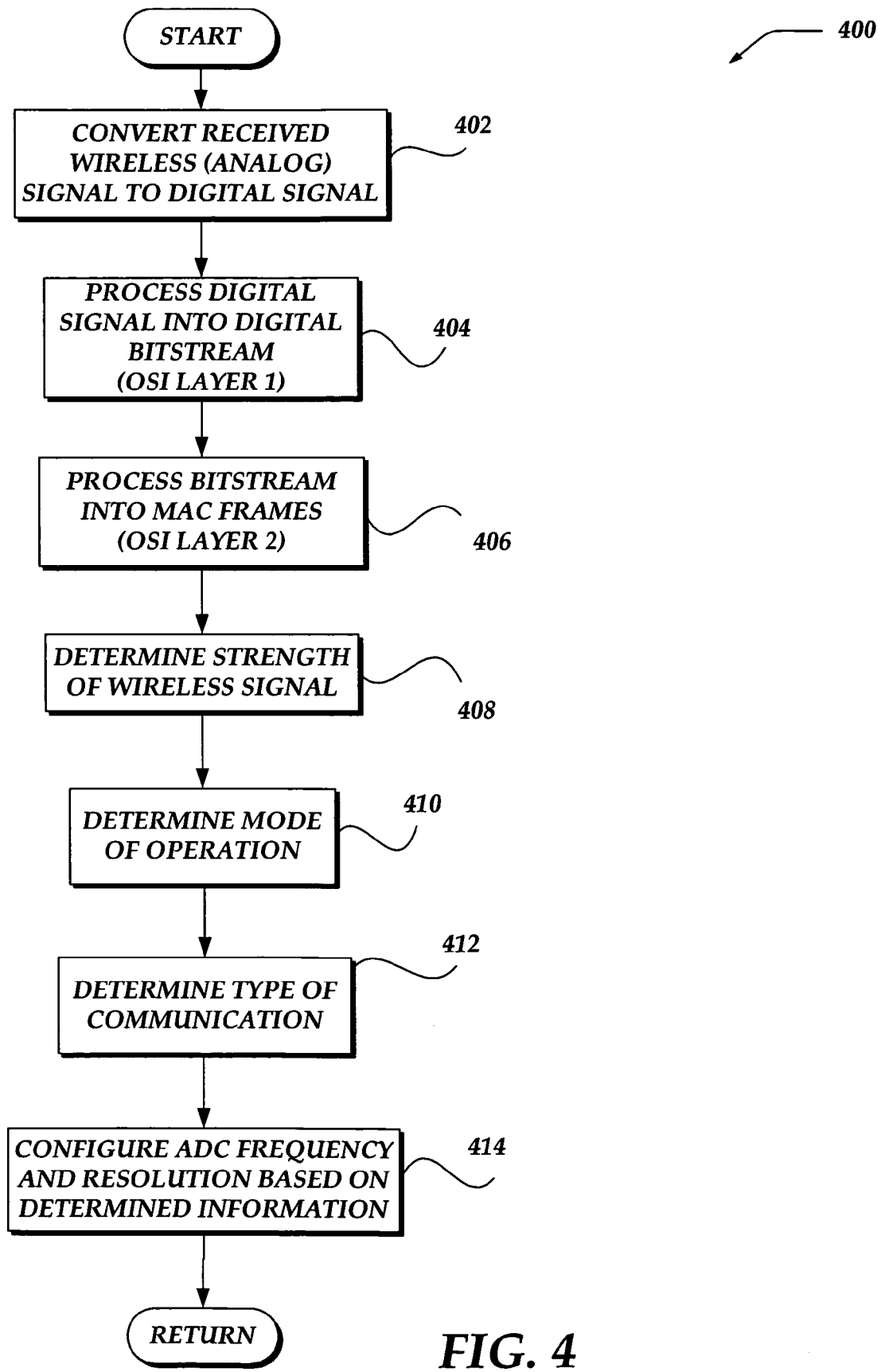
FIG. 4 shows an overview of a flowchart for arranging the resolution and/or frequency of a pipelined ADC based on the processing of a received wireless signal.

FIG. 4 illustrates overview 400 of a flowchart that generally shows a method for employing the strength and type of communication to configure the resolution and frequency of a pipelined ADC that processes the received wireless signal. Moving from a start block, the process flows to block 402 where a received wireless (analog) signal into a digital signal. At block 404, the digital signal is processed into a digital bit stream. In one embodiment, the processing of the digital signal into a bit stream is performed in accordance with Open Systems Interconnection (OSI) Layer 1.

At block 406, the digital bit stream is processed into frames. In one embodiment, the frames are arranged in the Media Access Control (MAC) format in accordance with Layer 2 of the OSI model. Stepping to block 408, the information included in the frames is employed to determine the strength of the received wireless signal. Flowing to block 410, a process is performed on the information included in the frames to determine the mode of operation, e.g., standby, or active communication. Advancing to block 412, the process determines the type of communication such as data or voice communication. In one embodiment, the process can also determine the type of wireless protocol associated with the received wireless signal. Stepping to block 414, the process configures the resolution and frequency of the inventive pipelined ADC for processing the received wireless signal based on the determined strength, mode and type of communication. Next, the process returns to processing other actions.

Figure 5:
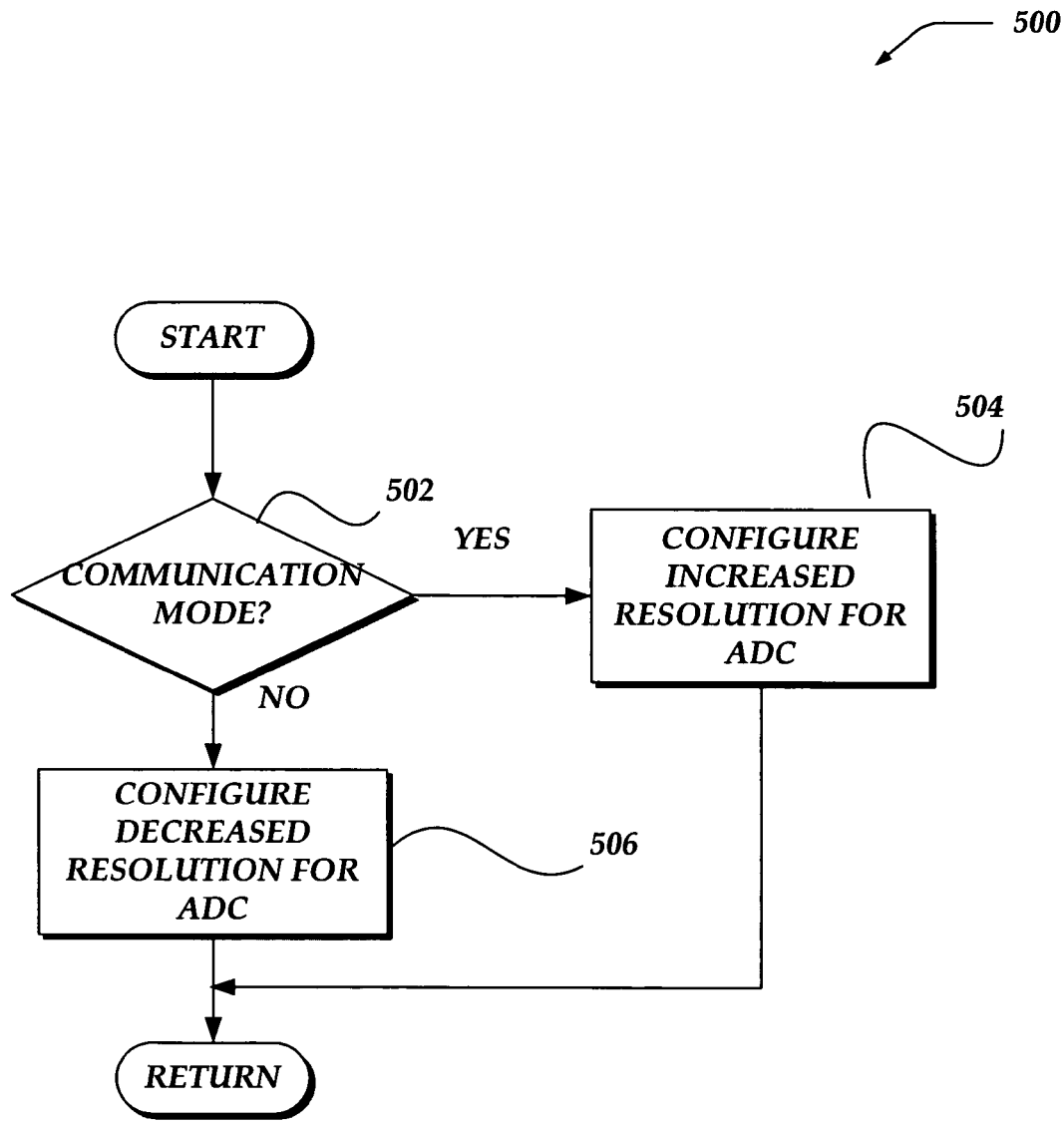
FIG. 5 illustrates an overview of a flowchart for arranging the resolution and/or frequency of a pipelined ADC based on the mode of operation for the received wireless signal.

FIG. 5 illustrates overview 500 of a flowchart that generally shows a method for determining the mode of communication associated with the received wireless signal. Moving from the start block, the process steps to decision block 502 where another determination is made as to whether or not the received wireless signal is operating in a communication mode. If the determination at decision block 502 is true, the process steps to block 504 where the resolution and/or frequency of the inventive pipelined ADC is increased to process the received wireless signal operating in a communication mode (receiving and/or transmitting data and/or voice). The communication mode is typically associated with a higher resolution and/or frequency for processing the received wireless signal. Next, the process returns to processing other actions.

Alternatively, if the determination at decision block 502 is false, the process steps to block 506 where the resolution and/or frequency of the inventive pipelined ADC is decreased to process the received wireless signal operating in a standby mode. The standby mode is typically associated with a lower resolution and/or frequency for processing the received wireless signal. Next, the process returns to processing other actions.

Figure 6:
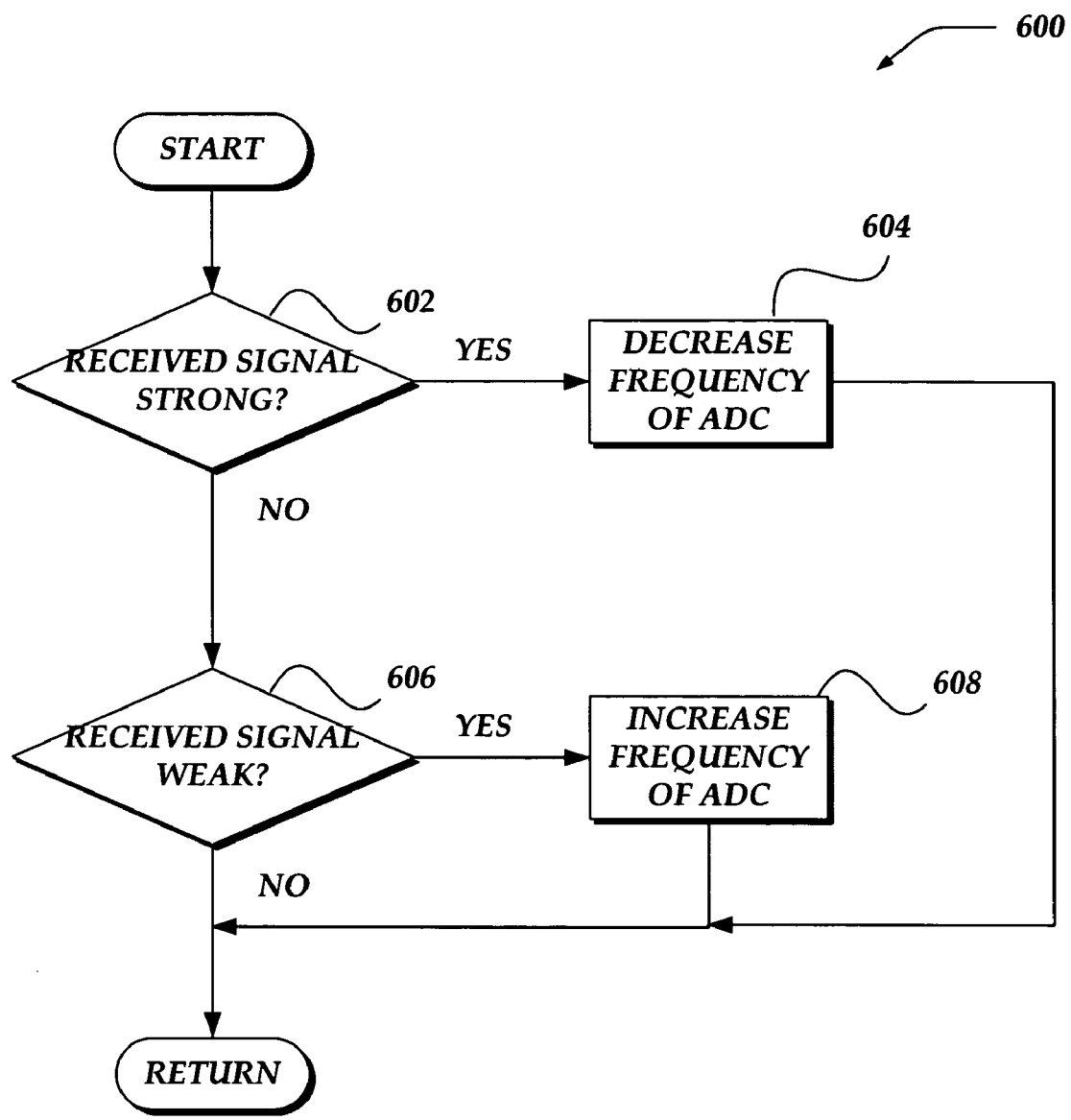
FIG. 6 shows an overview of a flowchart for arranging the resolution and/or frequency of a pipelined ADC based on the strength of the received wireless signal in accordance with the present invention.

FIG. 6 illustrates overview 600 of a flowchart that generally shows a method for configuring the operation of the inventive pipelined ADC in accordance with the relative strength of the received wireless signal. Moving from the start block, the process steps to decision block 602 where a determination is made as to whether or not the strength of the received wireless signal is relatively strong. If the strength of the received wireless signal is relatively strong, the process steps to block 604 where the frequency of the inventive pipelined ADC is decreased. Typically, the strength of the received signal is relatively strong if a mobile device is physically disposed relatively near an access point or another mobile device that is in communication with the mobile device. Next, the process returns to performing other actions.

However, if the determination at decision block 602 is false, the process advances to decision block 606 where the process determines if the strength of the received signal is relatively weak. If true, the process moves to block 608 where the frequency of the inventive pipelined ADC is increased. Typically, the strength of the received signal is relatively weak if a mobile device is physically disposed relatively far away from an access point or another mobile device that is in communication with the mobile device. Next, the process returns to performing other actions.

Moreover, it will be understood that each block of the flowchart illustrations discussed above, and combinations of blocks in the flowchart illustrations above, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer-implemented process such that the instructions, which execute on the processor, provide steps for implementing the actions specified in the flowchart block or blocks.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems, which perform the specified actions or steps, or combinations of special purpose hardware and computer instructions.

The above specification, examples and data provide a complete description of the manufacture and use of the composition of the invention. Since many embodiments of the invention can be made without departing from the spirit and scope of the invention, the invention resides in the claims hereinafter appended.

What is claimed as new and desired to be protected by Letters Patent of the United States is:

1. A pipelined Analog To Digital Converter (ADC), comprising:
   an input stage for sampling and holding an analog signal; and
   a plurality of pipelined stages that are hierarchically arranged to resolve the analog signal into at least one of a plurality of bits in the digital representation of the analog signal, wherein a resolution for processing the digital representation by at least one of the plurality of stages is enabled by information that is based on the digital representation, and wherein the information indicates at least a strength that is associated with the analog signal, and wherein the resolution is controlled based on at least the strength.

2. The ADC of claim 1, wherein the information further includes a mode, and wherein the mode indicates one of a standby mode and a communication mode, wherein the standby mode is associated with a resolution for processing the analog signal that is relatively less than another resolution for processing the analog signal that is associated with the communication mode.

3. The ADC of claim 1, wherein if the strength of the analog signal is determined to be relatively weak, a frequency of the ADC is increased for processing the analog signal, and wherein if the strength of the analog signal is determined to be relatively strong, the frequency of the ADC is decreased for processing the analog signal.

4. A pipelined Analog To Digital Converter (ADC), comprising:
   an input stage for sampling and holding an analog signal; and
   a plurality of pipelined stages that are hierarchically arranged to resolve the analog signal into at least one of a plurality of bits in the digital representation of the analog signal, wherein a resolution for processing the digital representation by at least one of the plurality of stages is enabled by information that is based on the digital representation, and wherein the information indicates at least one of a mode or a strength that is associated with the analog signal, wherein the information is arranged in at least one frame, and wherein the resolution is controlled based on at least one of the mode or the strength.

5. The ADC of claim 4, wherein the frame is formatted in accordance with a Media Access Control (MAC) format at Layer 2 of the OSI model.

6. A pipelined Analog To Digital Converter (ADC), comprising:
   an input stage for sampling and holding an analog signal; and
   a plurality of pipelined stages that are hierarchically arranged to resolve the analog signal into at least one of a plurality of bits in the digital representation of the analog signal, wherein a resolution for processing the digital representation by at least one of the plurality of stages is enabled by information that is based on the digital representation, and wherein the information indicates at least one of a mode or a strength that is associated with the analog signal, wherein at least one of the mode and the strength of the analog signal are employed to disable at least one of the plurality of stages and change a value of the frequency for processing the analog signal.

7. The ADC of claim 1, wherein each of the plurality of stages includes at least one Flash ADC component.

8. A pipelined Analog To Digital Converter (ADC), comprising:
   an input stage for sampling and holding an analog signal; and
   a plurality of pipelined stages that are hierarchically arranged to resolve the analog signal into at least one of a plurality of bits in the digital representation of the analog signal, wherein a resolution for processing the digital representation by at least one of the plurality of stages is enabled by information that is based on the digital representation, and wherein the information indicates at least one of a mode or a strength that is associated with the analog signal, wherein an output from each of the enabled stages is digitally correlated.

9. The ADC of claim 1, wherein at least one of the plurality of stages includes a sample and hold component.

10. A pipelined Analog To Digital Converter (ADC), comprising:
an input stage for sampling and holding an analog signal; and
a plurality of pipelined stages that are hierarchically arranged to resolve the analog signal into at least one of a plurality of bits in the digital representation of the analog signal, wherein a resolution for processing the digital representation by at least one of the plurality of stages is enabled by information that is based on the digital representation, and wherein the information indicates at least one of a mode or a strength that is associated with the analog signal, wherein the other indication is employed to enable at least one of the plurality of stages and change a frequency for processing the analog signal.

11. The ADC of claim 10, wherein the other indication is employable to disable at least one of the plurality of stages.

12. A method for converting an analog signal into a digital representation of the analog signal, comprising:
sampling the analog signal;
hierarchically resolving the analog signal into a plurality of bits associated with the digital representation of the analog signal, wherein processing the analog signal with at least one of a plurality of stages is enabled by information determined from the digital representation, and wherein the information indicates at least a strength that is associated with the analog signals and wherein the processing is controlled based on at least the strength; and
enabling an output of the digital representation of the analog signal.

13. The method of claim 12, wherein the information further includes a mode, and wherein the information regarding the mode indicates at least a size of a resolution for processing the analog signal.

14. The method of claim 12, wherein the information regarding the strength of the analog signal indicates at least a sampling frequency for processing the analog signal.

15. A method for converting an analog signal into a digital representation of the analog signal, comprising:
sampling the analog signal;
hierarchically resolving the analog signal into a plurality of bits associated with the digital representation of the analog signal, wherein processing the analog signal with at least one of a plurality of stages is enabled by information determined from the digital representation, and wherein the information indicates at least one of a mode or a strength that is associated with the analog signal, and wherein the processing is controlled based on at least one of the mode or the strength; and
enabling an output of the digital representation of the analog signal, wherein the information is arranged in at least one frame.

16. The method of claim 15, wherein the frame is formatted in accordance with a Media Access Control (MAC) format at Layer 2 of the OSI model.

17. A method for converting an analog signal into a digital representation of the analog signal, comprising:
sampling the analog signal;
hierarchically resolving the analog signal into a plurality of bits associated with the digital representation of the analog signal, wherein processing the analog signal with at least one of a plurality of stages is enabled by information determined from the digital representation, and wherein the information indicates at least one of a mode or a strength that is associated with the analog signal; and
enabling an output of the digital representation of the analog signal, wherein a wireless protocol indicated by the determined information is employed to disable at least one of the plurality of stages.

18. A pipelined Analog To Digital Converter (ADC), comprising:
an input stage for sampling and holding an analog signal; and
a plurality of pipelined stages that hierarchically resolve the analog signal into at least one of a plurality of bits associated with the digital representation of the analog signal, wherein a resolution and a frequency for processing the analog signal corresponds to the operation of a plurality of stages that are enabled based on information determined from the analog signal, and wherein the information indicates at least one of a mode and a strength of the analog signal.

19. The ADC of claim 18, wherein the information includes another indication for at least one of a mode of operation and a strength of the analog signal, wherein the other indication is employed to enable at least one of the resolution and the frequency for processing the analog signal.

* * * * *

UNITED STATES PATENT AND TRADEMARK OFFICE
CERTIFICATE OF CORRECTION

PATENT NO. : 7,205,923 B1
APPLICATION NO. : 11/007057
DATED : April 17, 2007
INVENTOR(S) : Bahai Page 1 of 1

It is certified that error appears in the above-identified patent and that said Letters Patent is hereby corrected as shown below:

On The Title Page, Item -57-, under "Abstract", line 14, delete "process" and insert -- processed --, therefor.

In column 9, line 35, in Claim 12, delete "signals" and insert -- signal, --, therefor.

Signed and Sealed this

Twelfth Day of June, 2007

JON W. DUDAS
*Director of the United States Patent and Trademark Office*